United States Patent
Di Franco et al.

(10) Patent No.: US 9,105,698 B2
(45) Date of Patent: Aug. 11, 2015

(54) MULTILEVEL INTERCONNECT STRUCTURES AND METHODS OF FABRICATING SAME

(71) Applicant: STMicroelectronics S.r.l., Agrate Brianza (IT)

(72) Inventors: Antonio Di Franco, Osnago (IT); Marco Bonifacio, Verderio Inferiore (IT); Silvio Cristofalo, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/304,111

(22) Filed: Jun. 13, 2014

(65) Prior Publication Data

US 2014/0300005 A1    Oct. 9, 2014

Related U.S. Application Data

(60) Continuation of application No. 14/048,295, filed on Oct. 8, 2013, now abandoned, which is a division of application No. 13/091,330, filed on Apr. 21, 2011, now Pat. No. 8,586,470.

(51) Int. Cl.
*H01L 21/768* (2006.01)
*H01L 21/02* (2006.01)
*H01L 23/522* (2006.01)
*H01L 23/48* (2006.01)

(52) U.S. Cl.
CPC .... *H01L 21/76877* (2013.01); *H01L 21/02274* (2013.01); *H01L 21/76801* (2013.01); *H01L 21/76804* (2013.01); *H01L 21/76805* (2013.01); *H01L 21/76819* (2013.01); *H01L 21/76837* (2013.01); *H01L 23/481* (2013.01); *H01L 23/5226* (2013.01); *H01L 2924/0002* (2013.01)

(58) Field of Classification Search
CPC ...................... H01L 21/02225; H01L 21/0226
See application file for complete search history.

(56) References Cited

U.S. PATENT DOCUMENTS

| | | | |
|---|---|---|---|
| 5,502,006 | A | 3/1996 | Kasagi |
| 6,187,668 | B1 | 2/2001 | Wu et al. |
| 6,337,268 | B1 | 1/2002 | Kido et al. |
| 6,410,446 | B1 | 6/2002 | Tsai et al. |
| 2007/0123040 | A1 | 5/2007 | Hwang et al. |
| 2008/0044971 | A1 | 2/2008 | Kang et al. |
| 2008/0169570 | A1 | 7/2008 | Saito |

FOREIGN PATENT DOCUMENTS

DE    10041039 A1    7/2001

OTHER PUBLICATIONS

Italian Search Report and Written Opinion mailed Oct. 26, 2010, for IT VI20100116 (10 pages).

*Primary Examiner* — Cheung Lee
(74) *Attorney, Agent, or Firm* — Gardere Wynne Sewell LLP

(57) ABSTRACT

A multilevel interconnect structure for a semiconductor device includes an intermetal dielectric layer with funnel-shaped connecting vias. The funnel-shaped connecting vias are provided in connection with systems exhibiting submicron spacings. The architecture of the multilevel interconnect structure provides a low resistance connecting via.

20 Claims, 5 Drawing Sheets

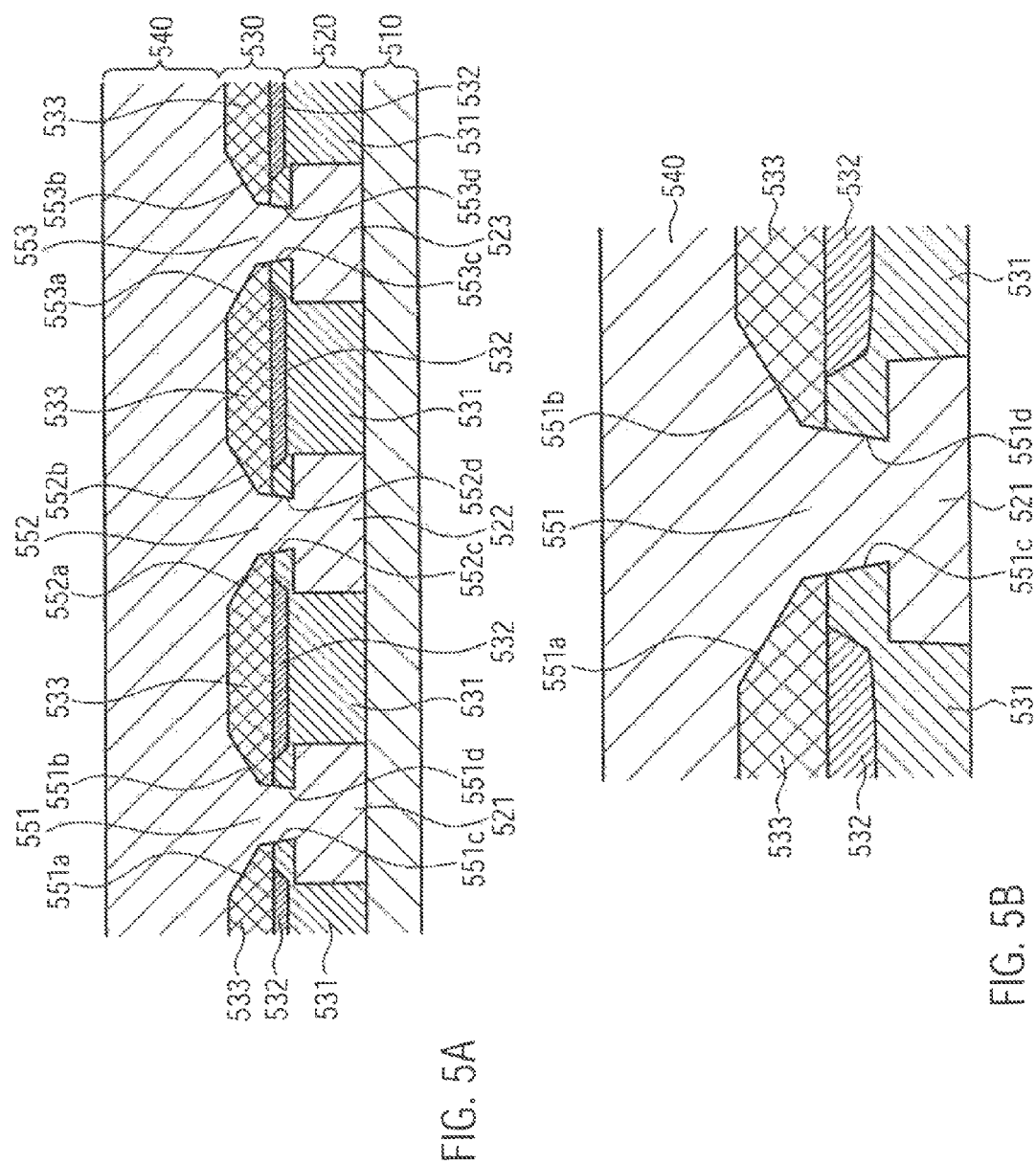

MULTILEVEL INTERCONNECT STRUCTURES AND METHODS OF FABRICATING SAME

PRIORITY CLAIM

The present application is a continuation of U.S. application Ser. No. 14/048,295 filed Oct. 8, 2013 and entitled "MULTILEVEL INTERCONNECT STRUCTURE AND METHODS OF FABRICATING SAME," which is a divisional of and claims priority to U.S. application Ser. No. 13/091,330 filed Apr. 21, 2011, the disclosure of which is incorporated herein by reference, and which claims priority to Italian Application for Patent No. VI2010A000116 filed Apr. 27, 2010, the disclosure of which is hereby incorporated by reference.

TECHNICAL FIELD

The present invention relates to the field of semiconductor technology and, in particular, to multilevel interconnect structures and to methods for fabricating same. Still more particularly, the present invention relates to multilevel interconnect structures comprising intermetal dielectric (IMD) architectures comprising funnel-shaped vias and to the methods for fabricating same.

BACKGROUND

One of the main challenges in the field of integrated circuits is the realization of electrical connections between the active devices of the system and between the system itself and other interrelated systems, for instance in the complex architecture of an electronic device. Further to the strong miniaturization trend of the active devices obtained in the field of semiconductor technologies, in fact, the structure and dimensions of the interconnect structures have become more and more important. In particular, at some point during the miniaturization trend, the area needed to route the interconnect lines between the active devices exceeded the area occupied by the devices themselves. At this point, continued miniaturization of the active devices did not produce further benefits as the overall dimensions of the system were constrained by the dimensions of the interconnect structures.

In order to overcome this limitation, the concept of multilevel interconnection has been implemented. In particular, according to the multilevel interconnection approach, the area needed by the interconnect lines is shared among two or more levels so as to allow the increase of the functional density of the system, i.e. of the number of interconnected devices per chip area.

Nowadays, multilevel interconnect structures play an important role in the field of integrated circuits because they accomplish the fundamental tasks of providing both electronic connections between the active devices of the system, and electronic connections to bonding pads adapted to provide interconnect points for the finished system. The final properties of the system and, in particular, its structural and electronic properties, strongly depend on the structural and electronic properties of the multilevel interconnect structures.

A schematic example of a multilevel interconnect structure known in the art is shown in FIG. 1. The system comprises a pre-metal dielectric (PMD) level 110, a first metal level 120, an intermetal dielectric (IMD) level 130 and a second metal level 140.

The PMD level 110 provides for the insulation between the upper level of the active devices of the system (not shown in FIG. 1) and the first metal level 120.

The first metal level 120 is patterned so as to exhibit three separate metal regions 121, 122 and 123. In particular, the metal regions 121, 122 and 123 are separated by portions of the IMD level 130. The spacing between the metal regions 121 and 122 and the spacing between the metal regions 122 and 123 measure 1 m or more.

The IMD level 130 provides for the insulation between the first metal level 120 and the second metal level 140 and also for the insulation between the separate metal regions 121, 122 and 123 of the first metal level 120. The IMD level 130 further comprises two funnel-shaped vias 151 and 152 providing the electric connections between the first metal level 120 and the second metal level 140. In particular, the funnel-shaped vias 151 and 152 connect the second metal level 140 with the metal region 122 of the first metal level 120.

The metal regions 121, 122 and 123 as well as the second metal level 140 and the funnel-shaped vias 151 and 152 are made of Aluminum (Al). In particular, as will be explained in detail below, thanks to the dimensions of the system, and thanks especially to the fact that the spacings between the metal regions 121, 122 and 123 of the first metal level 120 measure 1 m or more, the vias 151 and 152 are funnel-shaped and can be, accordingly, filled with Al.

In the following, the method for fabricating the structure shown in FIG. 1 will be described.

The first metal level 120 is formed depositing on the PMD level 110 an Al film by means of sputtering and by subsequently patterning the film by means of dry etching processes. The patterning process is employed to form the separate metal regions 121, 122 and 123.

In order to form the IMD level 130, chemical vapor deposition (CVD) is employed so as to form the silicon dioxide ($SiO_2$) layer 131. In particular, the silicon dioxide layer 131 is formed by the so-called TEOS oxide, i.e. $SiO_2$ obtained by means of thermal TEOS-CVD processes wherein Tetraethyl Orthosilicate (TEOS) is employed as source for $SiO_2$. As shown in the figure, TEOS grows not only above the metal regions 121, 122 and 123, but also in the interspaces between these regions. However, because of the presence of these interspaces, the TEOS layer 131 is not smooth, but it exhibits a stepped structure following the profile of the metal regions 121, 122 and 123. For this reason, spin on glass (SOG) planarization processes are performed in order to fill the gaps 132 formed by the TEOS layer 131 in correspondence to the interspaces between the metal regions 121, 122 and 123 and to smooth the upper surface of the dielectric. In particular, according to the SOG technique, an interlayer dielectric material is applied in liquid form so as to fill narrow spaces without causing voids. The process comprises spinning for obtaining thickness uniformity and curing for hardening the film. Finally, an etchback process is preformed in order to smooth the upper surfaces of both the TEOS layer 131 and of the SOG regions 132 and to make them level so as to obtain a smooth surface for the deposition of a second dielectric layer 133.

The second dielectric layer 133 is formed by means of a TEOS-CVD process so that, similarly to the layer 131, the layer 133 is made of TEOS oxide too.

At this point, the connecting vias 151 and 152 are formed in the intermetal dielectric level 130. In particular, the connecting vias 151 and 152 are opened through the TEOS layers 133 and 131 in correspondence to the metal region 122 of the first metal level 120. The position and dimensions of the vias are established by means of appropriate masks. The connecting vias 151 and 152 are made funnel-shaped as shown in FIG. 1 so as to easily fill them with Al. In particular, the funnel shape of the vias 151 and 152 strongly improves the filling by means of Al inhibiting the formation of voids, seams and/or other defects.

In the art of semiconductor technology, funnel-shaped vias are also referred to as vias with wine-glass-shaped sidewalls and the process for fabricating them can be referred to as wine-glass etch process. Basically, these vias comprise an upper wide portion corresponding to the mouth of the funnel (or to the bowl containing the wine in the wine-glass) and a lower narrow portion corresponding to the output portion of the funnel (or to the stem of the wine-glass).

Funnel shaped vias such as the vias 151 and 152 shown in FIG. 1, are fabricated by means of a two-step etch process: the upper portion of the IMD level is etched by means of an isotropic etch process while the lower portion of the IMD level is etched by means of an anisotropic etch process. In particular, the isotropic etch process allows the formation of the upper wide portion of the funnel. The upper wide portion of the funnels 151 and 152 comprise the side walls 151a and 151b, and 152a and 152b, respectively, exhibiting low slope. The anisotropic etch process allows the formation of the lower narrow portion of the funnel. The lower narrow portion of the funnels 151 and 152 comprise the steep side walls 151c and 151d, and 152c and 152d, respectively. Since the IMD level 130 in correspondence to the metal region 122 is formed by the first dielectric layer 131 comprising TEOS oxide and the second dielectric layer 132 comprising TEOS oxide as well, both the isotropic etch process and the anisotropic etch process are performed on the TEOS oxide. For this reason, the combination of isotropic etch step and anisotropic etch step allows the formation of well-defined vias exhibiting regular funnel shapes.

At this point, further metal deposition is employed for filling the vias and for forming the second metal level 140 in electric contact with the first metal level 120. In particular, Titanium (Ti) is firstly deposited as liner material on the side walls of the vias 151 and 152 and as adhesive material on the upper surface of the TEOS layer 133. Finally, Al is deposited so as to fill the vias and to form the second metal level 140.

The structure and the dimensions of the system shown in FIG. 1 are compatible with the SOG planarization process and with the formation of funnel-shaped vias to be filled with Al. In particular, since the spacings between the metal regions 121, 122 and 123 of the first metal level 120 measure 1 m or more, they can be filled by TEOS oxide (the layer 131) and SOG dielectric material (the volumes 132). Accordingly, the vias 151 and 152 are dug through a double layer of TEOS oxide (the layers 133 and 131) so that the funnel shape can be easily made by means of the two-step etch process comprising an isotropic step and an anisotropic step as described above.

FIG. 2 schematically displays an example of a multilevel interconnect structure for a system with submicron spacings. In particular, the system shown in FIG. 2, comprises a PMD level 210, a first metal level 220, a IMD level 230 and a second metal level 240. The first metal level 220 is made of Al and it comprises three separate metal regions 221, 222 and 223. Both the spacing between the metal regions 221 and 222 and the spacing between the metal regions 222 and 223 measure less than 1 m.

Since these spacings measure less than 1 m, it is not possible to fill them by means of TEOS oxide. In particular, TEOS oxide is not adapted to fill such narrow spaces because it leads to the formation of an unacceptable level of voids and defects. For this reason, TEOS oxide is replaced by HDP oxide, i.e. by $SiO_2$ deposited by means of High Density Plasma (HDP) deposition. As it is known in the art, HDP processes allow filling narrow spaces such as the spacings between the regions 221, 222 and 223 shown in FIG. 2 with an acceptable level of voids and defects.

Accordingly, the first dielectric layer 231 of the IMD level 230 is formed by HDP oxide. The planarization is performed by means of the CVD deposition of a second dielectric layer 232 of TEOS oxide and of chemical mechanical polishing (CMP) processes of the upper surface of this layer. As can be seen in FIG. 2, TEOS oxide of the layer 232 fills the depressions of the HDP layer 231 in correspondence to the spacings between the metal regions 221, 222 and 223 and provides for an upper smooth surface for the further deposition of the second metal level 240.

The system shown in FIG. 2 exhibits three vias 251, 252 and 253 electrically connecting the second metal level 240 with the metal region 222 of the first metal level 220. As can be seen in FIG. 2, the vias 251, 252 and 253 are not funnel shaped. On the contrary, they exhibit a frustoconical-like shape with steep side walls 251a, 251b, 252a, 252b, 253a, 253b having a slope of 85° or more.

There are mainly two reasons why the vias 251, 252 and 253 are not made funnel-shaped in this case.

A first reason concerns the space required for the formation of funnel-shaped vias. As can be clearly seen comparing for example FIG. 1 with FIG. 2, the upper portions of the funnel-shaped vias 151 and 152 require much more space than the upper portions of the frustoconical-like vias 251, 252 and 253. Accordingly, the frustoconical-like vias have been preferred in order to reduce the devices' overall size.

A second more important reason concerns the incompatibility of the structure of the IMD level 230 of the system shown in FIG. 2 with the two-step etch process necessary for the formation of the funnel-shaped vias. In particular, in order to form funnel-shaped vias through the IMD level 230, it would be necessary to perform the two-step etch process through the TEOS layer 232 and the HDP layer 231. It has been observed that the isotropic step of the two-step etch process causes the formation of irregular and unreliable structures exhibiting a high number of defects. This is in particular due to the different etch rates of the TEOS layer 232 and the HDP layer 231 during the isotropic etch process performed for the formation of the upper wide portion of the funnel-shaped vias. Moreover, the presence of the interface between the TEOS layer 232 and the HDP layer 231 in the region etched by means of the isotropic etch process is critical because this region is subject to unexpected behaviors during the isotropic etch process which give rise to the uncontrollable formation of defects and irregularities. The formation irregularities and defects in the structure of the vias is undesired because it can lead to electric failures and, in general, to unreliable devices.

The vias formed in the IMD level 230 having a structure as shown in FIG. 2 comprising a first dielectric layer 231 of HDP oxide and a second dielectric layer 232 of TEOS oxide are fabricated by means of a single step anisotropic etch process which gives rise to the steep side walls and, ultimately, to the frustoconical-like vias.

These vias cannot be filled with Al because of their shape. In particular, filling frustoconical-like vias with Al would give rise to the formation of an unacceptable level of defects such as voids or seams. For this reason, the vias 251, 252 and 253 are filled with Tungsten (W). In particular, a liner layer of Ti or Titanium Nitride (TiN) is firstly formed on the steep side walls of the vias, and, finally, the vias are filled with W.

After W deposition for filling the vias, etch back processes or chemical mechanical polishing processes are performed in order to planarize the upper surface of the system prior to the formation of the second metal level 240.

The second metal level 240 is formed by depositing a Ti adhesion layer followed by the deposition of Al.

Although the systems such as the one shown in FIG. 2 are widely employed because they guarantee a high level of miniaturization, they still exhibit some problems and drawbacks. In particular, the electrical resistance of the vias filled with W is 10-15 times higher than the electrical resistance of the vias filled with Al. Accordingly, when high currents flow through high resistance vias, high power is dissipated and the temperature of the system increases so that the risk of damage or destruction of the system is very high. This is for example the case for Bipolar-CMOS-DMOS (BCD) devices wherein very low top vias resistance has to be guaranteed. These devices can be employed, in fact, for audio power amplifiers wherein robustness to short circuit tests must be guaranteed. In these extreme conditions, very high currents (even of the order of 100 A) flow in the device for a short time (approximately 1 ms) until a big capacitor is charged, and very high power can be dissipated if the vias exhibit high resistance. This can lead to the destruction of the electronic component because of the heat developed.

Accordingly, it would be desirable to provide a method for the formation of multilevel interconnect structures allowing overcoming these problems. In particular, it would be desirable to provide a method for the formation of multilevel interconnect structures comprising funnel-shaped vias adapted to be filled with Al even for devices exhibiting submicron spacings in at least one of the conducting levels.

SUMMARY

Methods for the fabrication of a multilevel interconnect structure for semiconductor devices and multilevel interconnect structures for semiconductor devices are presented. Multilevel interconnect structures are provided with a layer of dielectric material deposited by means of high density plasma deposition and with at least a funnel-shaped connecting via wherein the upper wide portion of the funnel-shaped connecting via is entirely opened through a single kind of dielectric material. The presence of the layer of dielectric material deposited by means of high density plasma deposition allows the homogeneous filling of narrow spaces of the first conducting level even if these spaces are in the submicron range. Moreover, the idea of providing at least a funnel-shaped connecting via wherein the upper wide portion of the funnel-shaped connecting via is entirely opened through a single kind of dielectric material allows the obtainment of connecting vias with a defined and regular profile even in the presence of the dielectric layer comprising dielectric material deposited by means of high density plasma deposition. The funnel-shaped connecting vias can be filled with low resistance metals and/or metal alloys such as for example Al or Al:Si or Al:Cu alloys so that the power dissipation in the device is minimized.

According to an embodiment, a method for the fabrication of a multilevel interconnect structure for a semiconductor device is provided, comprising the following steps: providing an intermetal dielectric level adapted to separate a first conducting level from a second conducting level comprising depositing a first dielectric layer by high density plasma deposition; opening at least a funnel-shaped connecting via through said intermetal dielectric level wherein the upper wide portion of said funnel-shaped connecting via is entirely opened through a single kind of dielectric material.

According to a further embodiment, a method for the fabrication of a multilevel interconnect structure for a semiconductor device is provided, wherein both the upper wide portion and the lower narrow portion the funnel-shaped connecting via are entirely etched through the first dielectric layer. Accordingly, the funnel-shaped connecting via is entirely etched through a single layer of dielectric material deposited by means of high density plasma deposition and the profile of the via is regular and exhibits a low number of defects and irregularities.

According to a further embodiment, a method for the fabrication of a multilevel interconnect structure for a semiconductor device is provided further comprising depositing a second dielectric layer by high density plasma deposition on the first dielectric layer and opening the funnel-shaped connecting via through the first dielectric layer and the second dielectric layer so that both the upper wide portion and the lower narrow portion of the funnel-shaped connecting via are entirely opened through dielectric material deposited by means of high density plasma deposition. The presence of two layers of dielectric material deposited by high density plasma deposition allows removing the constraints on the lateral dimensions of the components of the multilevel interconnect structure because the via can be for example fabricated even in proximity of the spacings between conducting regions of the first conducting level of the multilevel interconnect structure. In particular, the second dielectric layer of material deposited by high density plasma deposition allows the planarization of the first dielectric layer. At the same time, the funnel-shaped connecting via is entirely etched through dielectric material deposited by means of high density plasma deposition and the profile of the via is regular and exhibits a low number of defects and irregularities.

According to a further embodiment, a method for the fabrication of a multilevel interconnect structure for a semiconductor device is provided, further comprising: depositing an intermediate dielectric layer on the first dielectric layer, depositing a second dielectric layer on the intermediate dielectric layer and the first dielectric layer, wherein the thickness of the second dielectric layer is so that the upper wide portion of the funnel-shaped connecting via is entirely opened through the second dielectric layer. The presence of two dielectric layers on the first dielectric layer allow the fabrication of the upper wide portion of the funnel-shaped connecting via entirely through the second dielectric layer so that the profile of the via is regular and exhibits a low number of defects and irregularities. Moreover, the presence of three layers of dielectric material allows removing the constraints on the lateral dimensions of the components of the multilevel interconnect structure because the via can be for example fabricated even in proximity of the spacings between conducting regions of the first conducting level of the multilevel interconnect structure.

According to a further embodiment, a method for the fabrication of a multilevel interconnect structure for a semiconductor device is provided, wherein chemical mechanical polishing is performed after the deposition of the intermediate dielectric layer and wherein the endpoint of the chemical mechanical polishing is at a level below the upper level of the first dielectric layer as deposited so that the second dielectric layer is deposited so as to be directly in contact with both the first dielectric layer and the intermediate dielectric layer. Accordingly, the intermediate dielectric layer is confined for example in the regions in correspondence to the spacings between the conducting regions of the first conducting level.

The upper wide portion of the funnel-shaped connecting via is therefore entirely dug through the second dielectric layer and the lower narrow portion of the funnel-shaped connecting via is dug through the second dielectric layer and through the first dielectric layer. The profile of the via is regular and exhibits a low number of defects and irregularities.

According to a further embodiment, a method for the fabrication of a multilevel interconnect structure for a semiconductor device is provided, wherein both the intermediate dielectric layer and the second dielectric layer are deposited by means of chemical vapor deposition. Accordingly, the fabrication costs of the device are reduced.

According to a further embodiment, a method for the fabrication of a multilevel interconnect structure for a semiconductor device is provided, wherein the first conducting level comprises two or more separate conducting regions wherein the width of the spacings between the separate conducting regions measures 1 m or less. Accordingly, high miniaturization levels can be achieved.

According to a further embodiment, a method for the fabrication of a multilevel interconnect structure for a semiconductor device is provided wherein the intermetal dielectric level comprises Silicon Dioxide $SiO_2$.

According to a further embodiment, a multilevel interconnect structure for a semiconductor device is provided, the interconnect structure comprising a first conducting level, a second conducting level and an intermetal dielectric level located between the first conducting level and the second conducting level, wherein the intermetal dielectric level comprises a first dielectric layer comprising a dielectric material deposited by high density plasma deposition, the first dielectric layer facing the first conducting level, and wherein the intermetal dielectric level further comprises at least a funnel-shaped connecting via for connecting the first conducting level to the second conducting level wherein the upper wide portion of the funnel-shaped connecting via is entirely housed in a single kind of dielectric material.

According to a further embodiment, a multilevel interconnect structure for a semiconductor device is provided, wherein both the upper wide portion and the lower narrow portion of the at least one funnel-shaped connecting via are entirely housed in the first dielectric layer.

According to a further embodiment, a multilevel interconnect structure for a semiconductor device is provided, further comprising a second dielectric layer comprising a dielectric material deposited by high density plasma deposition and directly in contact with the first dielectric layer, wherein the at least one funnel-shaped connecting via is opened through the first dielectric layer and the second dielectric layer so that both the upper wide portion and the lower narrow portion of the funnel-shaped connecting via are entirely housed in dielectric material deposited by means of high density plasma deposition.

According to a further embodiment, a multilevel interconnect structure for a semiconductor device is provided, further comprising an intermediate dielectric layer directly in contact with the first dielectric layer and a second dielectric layer directly in contact with both the first dielectric layer and the intermediate dielectric layer, wherein the thickness of said second dielectric layer is so that the upper wide portion of the funnel-shaped connecting via is entirely housed in the second dielectric layer.

According to a further embodiment, a multilevel interconnect structure for a semiconductor device is provided, wherein both the intermediate dielectric layer and the second dielectric layer comprise dielectric material deposited by means of chemical vapour deposition.

According to a further embodiment, a multilevel interconnect structure for a semiconductor device is provided, wherein said first conducting level comprises two or more separate conducting regions wherein the width of the spacings between the separate conducting regions measures 1 m or less.

According to a further embodiment, a multilevel interconnect structure for a semiconductor device is provided, wherein the intermetal dielectric level comprises Silicon Dioxide $SiO_2$.

According to a further embodiment, a multilevel interconnect structure for a semiconductor device is provided, wherein the at least one funnel-shaped connecting via is filled with one of Al, Al:Cu alloy or Al:Si alloy.

According to a further embodiment, a multilevel interconnect structure for a semiconductor device is provided, wherein the side walls of the at least one funnel-shaped connecting via are covered with a layer of liner material such as for example Ti or TiN.

According to a further embodiment, a multilevel interconnect structure for a semiconductor device is provided, wherein at least one of the first conducting level and the second conducting level comprises one of Al, Al:Cu alloy or Al:Si alloy.

According to a further embodiment, a semiconductor device is provided comprising the multilevel interconnect structure according to the present invention.

According to a further embodiment, the semiconductor device comprises a Bipolar-CMOS-DMOS (BCD) device.

BRIEF DESCRIPTION OF THE DRAWINGS

FIG. 5A schematically displays a multilevel interconnect structure according to a further embodiment of the present invention; and FIG. 5B schematically displays an enlarged detail of the multilevel interconnect structure shown in FIG. 5A.

DETAILED DESCRIPTION OF THE DRAWINGS

In the following, the present invention is described with reference to particular embodiments as shown in the enclosed Figures. Nevertheless, the present invention is not limited to the particular embodiments described in the following detailed description and shown in the Figures, but rather, the described embodiments simply exemplify several aspects of the present invention whose scope is defined by the claims.

Further modifications and variations of the present invention will be clear to the person skilled in the art. The present description has to be considered, therefore, as comprising all said modifications and/or variations of the present invention whose scope is defined by the claims.

Corresponding elements in the figures are indicated for simplicity with similar reference numbers.

Moreover, in the following, wherein not differently specified, the horizontal direction is the direction of the main surface of the semiconductor device. Consequently, the vertical direction is the direction perpendicular to the surface of the semiconductor device. Furthermore, the wording "funnel shaped vias" is employed for indicating vias which, in the art, are referred to also as "vias with wine-glass-shaped sidewalls".

Figure 1:
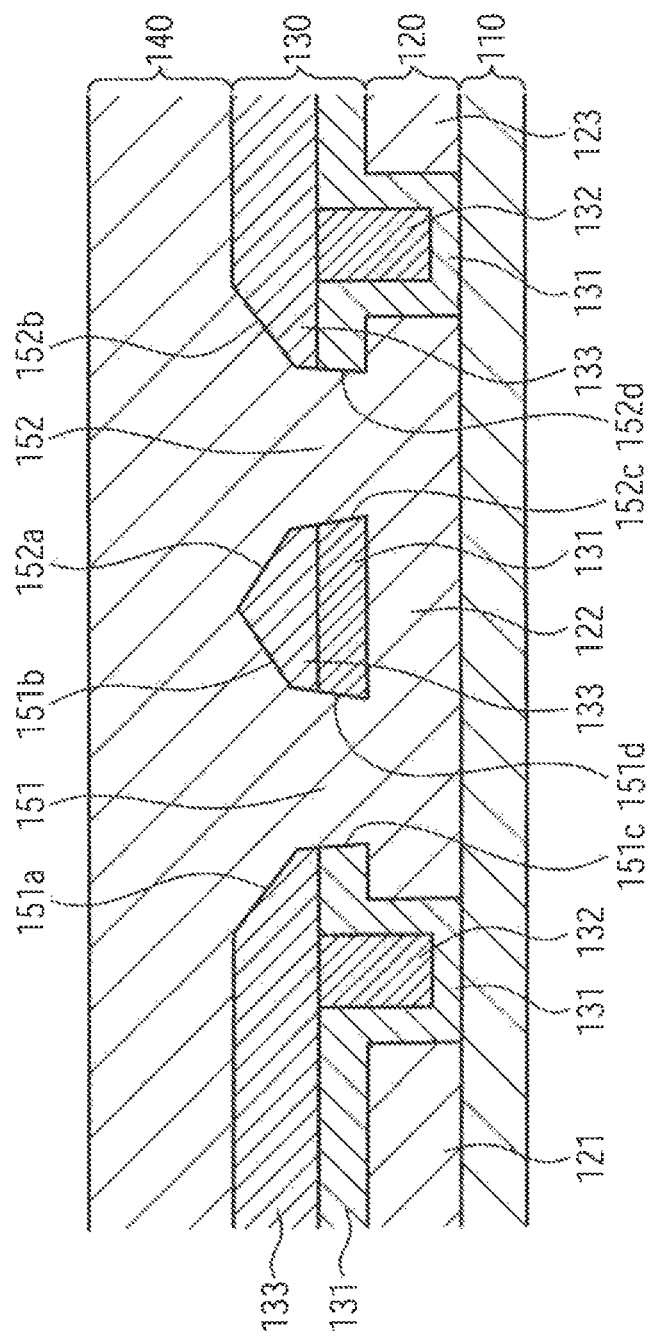
FIG. 1 schematically displays a multilevel interconnect structure for a system exhibiting spacings of 1 m or more according to the prior art.
Figure 2:
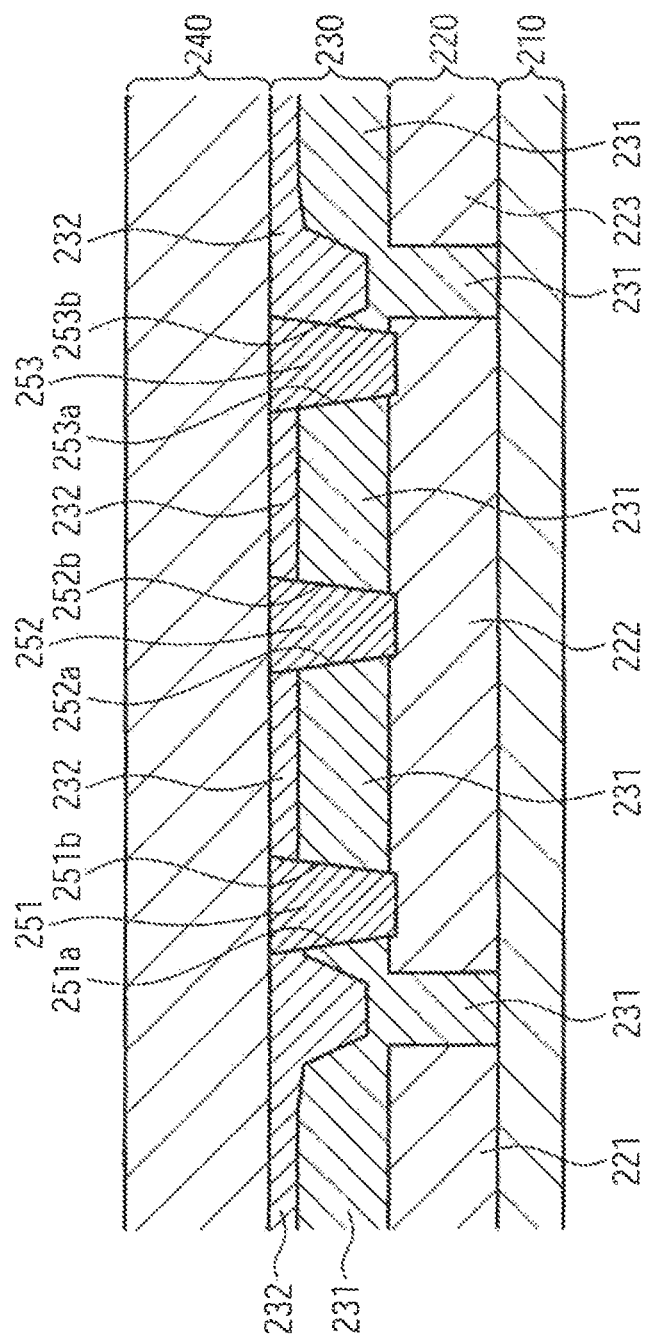
FIG. 2 schematically displays a multilevel interconnect structure for a system exhibiting submicron spacings according to the prior art.
Figure 3:
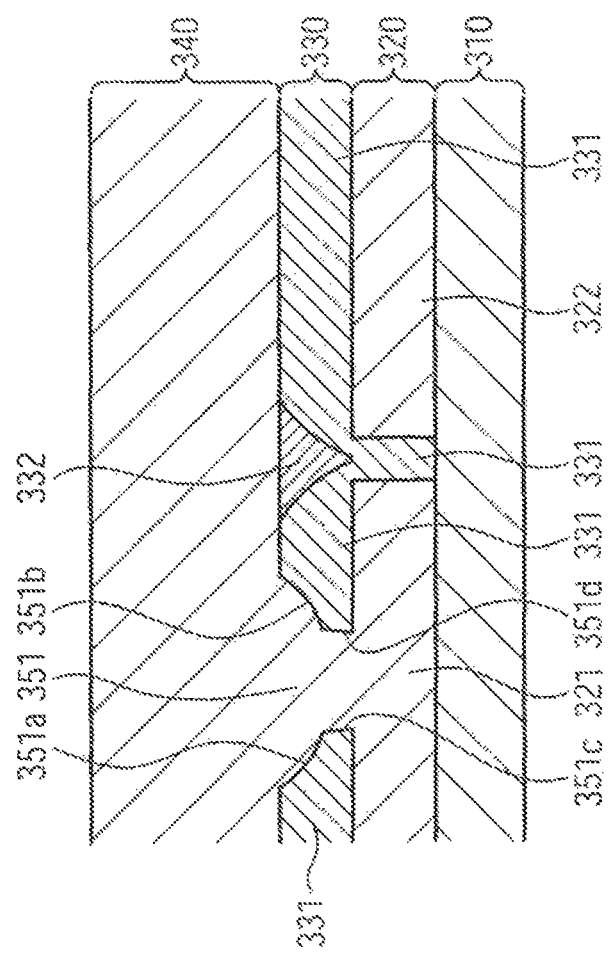
FIG. 3 schematically displays a multilevel interconnect structure according to an embodiment of the present invention.

FIG. 3 schematically displays a multilevel interconnect structure according to an embodiment.

The system comprises a substrate level 310, a first conducting level 320, an intermetal dielectric level (IMD) 330 and a second conducting level 340.

The substrate level 310 can comprise a dielectric layer for insulating the first conductive level 320 from any kind of layer located below. For example, the substrate level 310 can comprise a pre-metallic dielectric (PMD) level providing electrical insulation between the upper level of the active devices of the system not shown in the figure and the first conducting level 320. Moreover, the substrate level 310 can comprise an intermetal dielectric (IMD) level providing insulation between a conducting level located below and not shown in the figure and the first conducting level 320.

The first conducting level 320 comprises two conductive regions 321 and 322 separated by means of a spacing region. The lateral width of the spacing region can measure 1 m or more. Moreover, according to particularly advantageous embodiments, the lateral width of the spacing region can measure less than 1 m. For example, the lateral spacing can measure from 0.2 to 0.7 m. The thickness of the first conducting level 320 can range for instance from 0.4 m to 1 m.

The first conducting level 320 can comprise for instance a metal or a metal alloy. Moreover, the first conducting level 320 can comprise an adhesive layer for improving the bonding with the substrate level 310. The adhesive layer can comprise for instance a Ti layer or a TiN layer. The metal can comprise Al and the metal alloy can comprise Al:Si or Al:Cu alloys. The deposition of the metal can be performed for instance by means of sputtering techniques. Alternatively, the deposition can be performed by means of evaporation techniques. The spacings, i.e. the formation of separate conductive regions, can be performed for example by means of patterning techniques such as dry etching techniques.

After patterning of the first conductive level 320, the IMD level 330 is formed.

At first, a first dielectric layer 331 directly in contact with the upper surface of the first conductive level 320 is formed. The first dielectric layer 331 is formed by means of high density plasma (HDP) deposition. The first dielectric layer 331 can comprise for instance HDP $SiO_2$, i.e. silicon dioxide deposited by means of HDP deposition. The dielectric material deposited by means of HDP deposition for forming the first dielectric layer 331 completely fills the spacings between the separate conducting regions of the first conductive level 320. In particular, HDP deposition processes are particularly indicated for efficiently filling spacings having a width in the submicron range. The layer 331 grows also in correspondence to the upper surfaces of the conducting regions 321 and 322 so as to form an insulating layer above these regions. The thickness of the dielectric material layer 331 as deposited can range for example from 0.6 m to 1.2 m.

Because of the presence of the spacings between the conducting regions of the first conducting level 320, the upper surface of the dielectric material layer 331 as deposited is not smooth, but it exhibits depressions. These depressions are filled by means of a further deposition of dielectric material followed by chemical mechanical polishing processes. In particular, a second dielectric material can be deposited by means of chemical vapor deposition. For example, the dielectric material can comprise TEOS oxide, i.e. $SiO_2$ obtained by means of thermal TEOS-CVD processes wherein Tetraethyl Orthosilicate (TEOS) is employed as source for $SiO_2$.

A TEOS layer is deposited by CVD on the first dielectric layer 331. After TEOS deposition, chemical mechanical polishing is performed so that the final thickness of the IMD level measured from the upper surface of one of the conductive regions of the first conductive level 320 is lower than the thickness of the first HDP dielectric layer 331 as deposited measured from the upper surface of one of the conductive regions of the first conductive level 320. Accordingly, as can be clearly seen in FIG. 3, after CMP, the IMD level 330 comprises a first dielectric layer 331 facing the first conductive level 320 and TEOS regions 332 facing the second conductive level 340. Moreover, the TEOS regions 332 are located only in correspondence to the spacings between the conductive regions of the first conductive level 320. In other words, according to the architecture of the system as shown in FIG. 3, the first dielectric layer 331 of the IMD level 330 is not only in contact with the first conductive level 320, but also with the second conductive level 340. The second dielectric material of the IMD level 330 is confined in regions facing the second conductive level 340 but located only in correspondence to the spacings between the conductive regions of the first conductive level 320 as shown, for instance, by region 332 in FIG. 3.

Because of this architecture according to which the second dielectric material of the IMD level 330 is confined in regions corresponding to the spacings between the conductive regions of the first conductive level 320, it is possible to fabricate the vias entirely through the first dielectric layer 331. In particular, the vias are fabricated far enough from the spacings between the conductive regions of the first conductive level 320 so as to be entirely fabricated through the first dielectric layer 331. For spacings whose width measures approximately 0.5 m to 0.7 m, the vias can be fabricated for instance at a lateral distance of at least 1.2 m from the spacing.

In the example shown in FIG. 3, the spacing between the conductive regions 321 and 322 has a lateral width of 0.6 m and the via 351 is at a lateral distance of at least 1.2 m from the spacing. As can be seen in FIG. 3, the via 351 is entirely fabricated through the first dielectric layer 331 of the IMD level 330. The via 351 is not in contact with the region 332 of the IMD level 330. Accordingly, the two-step etch process comprising an isotropic step and an anisotropic step acts only on the first dielectric layer 331 and gives rise to the funnel shape.

In particular, the isotropic etch step allows the formation of the upper side walls 351a and 351b of the vias 351. The sidewalls 351a and 351b exhibit low slope and give rise to the upper wide portion of the funnel. Since the isotropic etching process acts only on the dielectric material of the first dielectric layer 331 deposited by means of HDP deposition, the formation of irregularities and/or defects during the fabrication of the side walls of the upper wide portion of the funnel-shaped via is inhibited. In particular, since the upper wide portion of the funnel-shaped via is entirely etched through a single kind of dielectric material (in this case, through a single layer of HDP dielectric material), the formation of irregularities and/or defects is inhibited especially because no differences in the etch rate of the dielectric material can arise during the isotropic etch process.

The anisotropic etch step allows the formation of the lower side walls 351c and 351d of the vias 351. The sidewalls 351c and 351d are steep and give rise to the lower narrow portion of the funnel.

After the formation of the funnel shaped vias such as the via 351 shown in FIG. 3, the vias can be filled with conducting material. In particular, the side walls of the vias can be provided with liner conducting material layers such as for example Ti or TiN. Finally, the vias can be filled with conducting materials such as metals and/or metal alloys. Since the vias are funnel shaped, they can be filled for example with Al and/or with Al alloys such as Al:Si or Al:Cu alloys.

The conducting materials filling the vias can be deposited for instance by means of sputtering and/or evaporation techniques.

Finally, the second conducting level 340 is formed. The second conducting level 340 can be for example the uppermost conducting level of the multilevel interconnect structure. The second conducting level 340 can comprise an adhesion layer made for example of Ti or TiN and guaranteeing the bonding to the upper surface of the IMD level 330. Moreover, the second conducting level 340 can comprise metals, such as Al, and/or metal alloys, such as Al:Si and Al:Cu alloys. The formation of the second conducting level 340 can be performed simultaneously to the filling of the vias. For example, the formation of liner material on the side walls of the vias can be performed simultaneously to the formation of the adhesion layer on the upper surface of the IMD level 330. Moreover, the filling of the vias can be performed with the same process employed for the deposition of conducting materials such as Al or Al alloys for the second conducting level 340.

The embodiment shown in FIG. 3 and described above is particularly advantageous for devices wherein the level of miniaturization is not relevant. For example, in case the vias are fabricated with a maximum upper width of 0.8 m and at a lateral distance of at least 1.2 m from the spacing between conducting regions of the first conducting level, said conducting regions have a minimum lateral width of 3.2 m.

Figure 4:
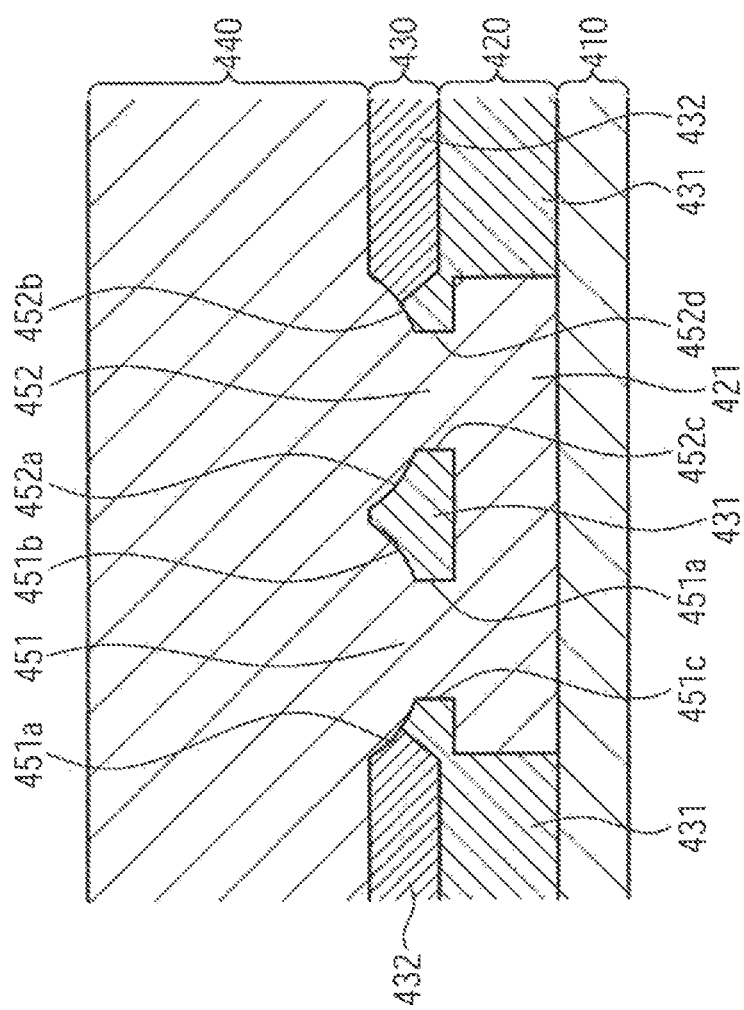
FIG. 4 schematically displays a multilevel interconnect structure according to a further embodiment of the present invention.

FIG. 4 schematically displays a multilevel interconnect structure according to a further embodiment.

The system comprises a substrate level 410, a first conducting level 420, an intermetal dielectric level (IMD) 430 and a second conducting level 440.

The substrate level 410 can comprise a dielectric layer for insulating the first conductive level 420 from any kind of layer located below. For example, the substrate level 410 can comprise a pre-metallic dielectric (PMD) level providing electrical insulation between the upper level of the active devices of the system and the first conducting level 420. Moreover, the substrate level 410 can comprise an intermetal dielectric (IMD) level providing insulation between a conducting level located below and not shown in the figure and the first conducting level 420.

The first conducting level 420 comprises a single conducting region 421. However, the first conducting level 420 can comprise two or more separate conducting regions. The conducting regions are separate by means of spacings whose lateral width can measure 1 m or more. Moreover, according to particularly advantageous embodiments, the lateral width of the spacings can measure less than 1 m. For example, the lateral spacing can measure from 0.2 m to 0.7 m. The thickness of the first conducting level 420 can range for instance from 0.4 m to 1 m.

The first conducting level 420 can comprise for instance a metal or a metal alloy. Moreover, the first conducting level 420 can comprise an adhesive layer for improving the bonding with the substrate level 410. The adhesive layer can comprise for instance a Ti layer or a TiN layer. The metal can comprise Al and the metal alloy can comprise Al:Si or Al:Cu alloys. The deposition of the metal can be performed for instance by means of sputtering techniques. Alternatively, the deposition can be performed by means of evaporation techniques. The spacings, i.e. the formation of separate conductive regions, can be performed for example by means of patterning techniques such as dry etching techniques.

After patterning of the first conductive level 420, the IMD level 430 is formed.

At first, a first dielectric layer 431 directly in contact with the upper surface of the first conductive level 420 is formed. The first dielectric layer 431 is formed by means of high density plasma (HDP) deposition. The first dielectric layer 431 can comprise for instance HDP $SiO_2$, i.e. silicon dioxide deposited by means of HDP deposition. The dielectric material deposited by means of HDP deposition for forming the first dielectric layer 431 completely fills the spacings between the separate conducting regions of the first conductive level 420. In particular, HDP deposition processes are particularly indicated for efficiently filling spacings having a width in the submicron range. The layer 431 grows also in correspondence to the upper surface of the conducting region 421 so as to form an insulating layer above this region. The thickness of the dielectric material layer 431 as deposited can range for example from 0.6 m to 1.2 m.

Because of the presence of the spacings between the conducting regions of the first conducting level 420, the upper surface of the dielectric material layer 431 as deposited is not smooth, but it exhibits depressions. These depressions are filled by means of a further deposition of dielectric material followed by chemical mechanical polishing processes. In particular, a second dielectric material can be deposited by means of HDP deposition so as to form a second dielectric layer 432. For example, the dielectric material can comprise HDP oxide, i.e. oxide obtained by means of high density plasma deposition. The HDP oxide can comprise for instance HDP $SiO_2$. The thickness of the second dielectric layer 432 as deposited can range for example from 0.6 m to 1.2 m.

The deposition of the second dielectric material is followed by chemical mechanical polishing so as to smooth the upper surface of the layer. After CMP, the total thickness of the IMD level 430 measured from the upper surface of the conducting regions of the first conducting level 420 can range for example from 0.7 m to 1 m.

Accordingly, the IMD level 430 comprises a first dielectric layer 431 comprising a first dielectric material deposited by high density plasma deposition and facing the first conducting level 420 and a second dielectric layer 432 comprising a second dielectric material deposited by high density plasma deposition and facing the second conducting level 440. In other words, the IMD level 430 of the structure shown in FIG. 4 comprises two dielectric layers which comprise material formed by HDP deposition.

Because of this architecture according to which both the first and the second dielectric layers 431 and 432, respectively, of the IMD level 430 comprise dielectric material formed by HDP deposition, it is possible to fabricate the connecting vias entirely through dielectric materials having the same physicochemical properties. In particular, the two-step etch process comprising an isotropic step and an anisotropic step acts first on the HDP layer 432 and then on the HDP layer 431, and gives rise to the funnel shape.

In particular, the isotropic etch step allows the formation of the upper side walls 451a and 451b of the via 451 and of the upper side walls 452a and 452b of the via 452. The sidewalls 451a, 451b, 452a and 452b exhibit low slope and give rise to the upper wide portions of the funnels. Since the isotropic etching process acts only on HDP deposited dielectric material, the formation of irregularities and/or defects during the fabrication of the side walls of the upper portions of the funnel-shaped vias is inhibited. In particular, as can be seen in the schematic representation of FIG. 4, the sidewalls 451a, 451b, 452a and 452b comprise both portions of the second dielectric layer 432 and portions of the first dielectric layer 431. However, these sidewalls do not exhibit defects because the second dielectric layer and the first dielectric layer are both formed by dielectric material deposited by high density plasma deposition so that the isotropic etch process acts in the same way on both materials. In particular, since the upper wide portion of the funnel-shaped vias is entirely etched through a single kind of dielectric material (in this case, through a double layer of HDP dielectric material), the formation of irregularities and/or defects is inhibited. In particular, during the isotropic etch process, there are no differences between the etch rate of the material of the first dielectric layer 431 and the etch rate of the material of the second dielectric layer 432.

The anisotropic etch step allows the formation of the lower side walls 451c and 451d of the via 451 and of the lower sidewalls 452c and 452d of the via 452. The sidewalls 451c, 451d, 452c and 452d are steep and give rise to the lower narrow portions of the funnels.

After the formation of the funnel shaped vias such as the vias 451 and 452 shown in FIG. 4, the vias can be filled with conducting material. In particular, the side walls of the vias can be provided with liner conducting material layers such as for example Ti or TiN. Finally, the vias can be filled with conducting materials such as metals and/or metal alloys. Since the vias are funnel shaped, they can be filled for example with Al and/or with Al alloys such as Al:Si or Al:Cu alloys.

The conducting materials filling the vias can be deposited for instance by means of sputtering and/or evaporation techniques.

Finally, the second conducting level 440 is formed. The second conducting level 440 can be for example the uppermost conducting level of the multilevel interconnect structure. The second conducting level 440 can comprise an adhesion layer made for example of Ti or TiN and guaranteeing the bonding to the upper surface of the IMD level 430. Moreover, the second conducting level 440 can comprise metals, such as Al, and/or metal alloys, such as Al:Si and Al:Cu alloys. The formation of the second conducting level 440 can be performed simultaneously to the filling of the vias. For example, the formation of liner material on the side walls of the vias can be performed simultaneously to the formation of the adhesion layer on the upper surface of the IMD level 430. Moreover, the filling of the vias can be performed with the same process employed for the deposition of conducting materials such as Al or Al alloys for the second conducting level 440.

Since the IMD level 430 of the structure shown in FIG. 4 comprises two adjacent dielectric layers formed by means of HDP deposition, there are no constraints for the lateral dimensions of the system. In particular, it is not necessary for the vias to be fabricated at least at a specific minimum lateral distance from the spacing between the conducting regions of the first conducting level. Accordingly, the architecture of the multilevel interconnect structure as shown in FIG. 4 is particularly advantageous for devices wherein the miniaturization level is relevant. In particular, the architecture of the multilevel interconnect structure as shown in FIG. 4 is compatible with high miniaturization levels, for instance for devices wherein the maximum lateral width of the conductive regions of the first conducting level is 2 m or less.

FIGS. 5A and 5B schematically display a multilevel interconnect structure according to a further embodiment.

The system comprises a substrate level 510, a first conducting level 520, an intermetal dielectric level (IMD) 530 and a second conducting level 540.

The substrate level 510 can comprise a dielectric layer for insulating the first conductive level 520 from any kind of layer located below. For example, the substrate level 510 can comprise a pre-metallic dielectric (PMD) level providing electrical insulation between the upper level of the active devices of the system and the first conducting level 520. Moreover, the substrate level 510 can comprise an intermetal dielectric (IMD) level providing insulation between a conducting level located below and not shown in the figure and the first conducting level 520.

The first conducting level 520 comprises three separate conducting regions 521, 522 and 523. However, the first conducting level 520 can comprise any number of separate conducting regions. The conducting regions are separate by means of spacings whose lateral width can measure 1 m or more. Moreover, according to particularly advantageous embodiments, the lateral width of the spacings can measure less than 1 m. For example, the lateral spacing can measure from 0.2 m to 0.7 m. The thickness of the first conducting level 520 can range for instance from 0.4 m to 1 m.

The first conducting level 520 can comprise for instance a metal or a metal alloy. Moreover, the first conducting level 520 can comprise an adhesive layer for improving the bonding with the substrate level 510. The adhesive layer can comprise for instance a Ti layer or a TiN layer. The metal can comprise Al and the metal alloy can comprise Al:Si or Al:Cu alloys. The deposition of the metal can be performed for instance by means of sputtering techniques. Alternatively, the deposition can be performed by means of evaporation techniques. The spacings, i.e. the formation of separate conductive regions, can be performed for example by means of patterning techniques such as dry etching techniques.

After patterning of the first conductive level 520, the IMD level 530 is formed.

At first, a first dielectric layer 531 directly in contact with the upper surface of the first conductive level 520 is formed. The first dielectric layer 531 is formed by means of high density plasma (HDP) deposition. The first dielectric layer 531 can comprise for instance HDP $SiO_2$, i.e. silicon dioxide deposited by means of HDP deposition. The dielectric material deposited by means of HDP deposition for forming the first dielectric layer 531 completely fills the spacings between the separate conducting regions of the first conductive level 520. In particular, HDP deposition processes are particularly indicated for efficiently filling spacings having a width in the submicron range. The layer 531 grows also in correspondence to the upper surfaces of the conducting regions 521, 522 and 523 so as to form an insulating layer above these regions. The thickness of the dielectric material layer 531 as deposited by means of high density plasma deposition can range for example from 0.6 m to 1.2 m.

Because of the presence of the spacings between the conducting regions of the first conducting level 520, the upper surface of the dielectric material layer 531 as deposited is not smooth, but it exhibits depressions. In other words, the upper surface of the first dielectric material layer 531 as deposited exhibits protrusions in correspondence to the conducting regions of the first conducting level 520 and depressions in correspondence to the spacings between said conducting regions. This structure comprising protrusions and depressions can be levelled out by means of a further deposition of dielectric material followed by chemical mechanical polishing processes.

In particular, the dielectric material can be deposited by means of CVD deposition so as to form an intermediate dielectric layer 532. For example, the dielectric material can comprise TEOS oxide, i.e. $SiO_2$ obtained by means of thermal TEOS-CVD processes wherein Tetraethyl Orthosilicate (TEOS) is employed as source for $SiO_2$. The thickness of the intermediate dielectric layer 532 as deposited can range for example from 0.5 m to 0.8 m as measured from the upper surface of the first dielectric material layer 531 as deposited.

The deposition of the intermediate dielectric material can be followed by chemical mechanical polishing so as to smooth the upper surface of the layer. The CMP process is performed so that the dielectric structure obtained after this CMP process exhibit a smooth upper surface and comprises regions of dielectric material deposited by chemical vapor deposition in correspondence to the spacings between the conducting regions of the first conducting level 520. The endpoint of the CMP process can be chosen at a level below the upper surface of the first dielectric layer 531 as deposited. In this way, the upper surface of the dielectric structure formed after the CMP process is smooth. Moreover, the upper surface of the dielectric structure formed after the CMP process in correspondence to the conducting regions of the first conducting level 520 corresponds to the upper surface of the first dielectric layer 531. On the contrary, the upper surface of the dielectric structure formed after the CMP process in correspondence to the spacings between the conducting regions of the first conducting level 520 corresponds to the upper surface of the intermediate dielectric layer 532. Accordingly, if a subsequent layer is deposited on the system, this layer will be directly in contact with both the first dielectric layer 531 and the intermediate dielectric layer 532.

For example, after having deposited a first dielectric material layer 531 having a thickness of about 0.6 m to 1.2 m and exhibiting protrusions and depressions and an intermediate dielectric layer 532 having a thickness of about 0.5 m to 0.8 m as measured from the upper surface of the first dielectric material layer 531, CMP can be performed so as to obtain a dielectric structure comprising the first dielectric layer 531 and the intermediate dielectric layer 532 and having a total thickness of about 0.4 m to 0.5 m as measured from the upper surfaces of the conducting regions 521, 522 and 523.

After the CMP process, a second dielectric layer 533 is deposited on the system. The second dielectric layer 533 can be deposited by means of CVD. For example, the dielectric material can comprise TEOS oxide, i.e. $SiO_2$ obtained by means of thermal TEOS-CVD processes wherein Tetraethyl Orthosilicate (TEOS) is employed as source for $SiO_2$.

As mentioned above, the lower surface of the second dielectric layer 533 is directly in contact with both the upper surface of the first dielectric layer 531 and the upper surface of the intermediate dielectric layer 532.

The thickness of the second dielectric layer 533 is chosen so as to allow digging the upper wide portions of the funnel-shaped connecting vias entirely in this second dielectric layer 533 as explained in detail below.

The thickness of the second dielectric layer 532 as deposited can range for example from 0.6 m to 0.7 m. In this case, after the deposition of the second dielectric layer 533, the total thickness of the IMD level 530 measured from the upper surface of the conducting regions of the first conducting level 520 ranges from 1.0 m to 1.2 m.

The process just described is particularly advantageous. The deposition of the first dielectric layer 531 allows filling efficiently the narrow spacings between the separate conducting regions of the first conducting level. The deposition of the intermediate dielectric layer 532 allows filling the depressions formed in the first dielectric layer 531. The CMP process performed after the deposition of the intermediate dielectric layer 532 allows obtaining a smooth surface for the deposition of the second dielectric layer 533. The deposition of the second dielectric layer 533 is engineered so that the thickness of this layer is adapted to entirely dig the upper wide portions of the funnel-shaped conducting vias in this layer.

The embodiment according to which both the intermediate dielectric layer 532 and the second dielectric layer 533 are deposited by means of CVD is particularly advantageous because it allows reducing the fabrication costs as CVD processes are less expensive, for example, than HDP processes.

The deposition of the intermediate dielectric layer 532 followed by the CMP process and by the deposition of the second dielectric layer 533 allows overcoming a series of drawbacks that would arise, for example, depositing by CVD a single dielectric layer on the first dielectric layer 531 deposited by HDP. In order to fill the depressions formed in the first dielectric layer 531 as deposited and to provide a layer having enough thickness so as to entirely dig the upper wide portions of the funnel-shaped vias through it, it would be, in fact, necessary to deposit by CVD a single layer having at least a thickness of 2-2.5 m on the first dielectric layer 531. Accordingly, the CVD deposition process would become expensive and time consuming. Moreover, it would be necessary to dig the funnel-shaped vias through an IMD level having a high total thickness. Accordingly, the aspect ratio of the vias would increase rendering their filling more complicate. Increasing the lateral dimensions of the vias so as to maintain their aspect ratio low would necessarily imply an increase of the overall dimensions of the system. Moreover, because of the total thickness of the IMD level, the two step etch process required for the formation of the funnel-shaped vias would be time consuming and expensive. Furthermore, the long duration of the two step etch process would require an increase of the thickness of the mask employed for the process itself, thus increasing the costs and the time required for the fabrication of the mask and worsening the resolution achievable with the etch process. The deposition on the first dielectric layer 531 of an intermediate dielectric layer 532 followed by CMP and by the deposition of the second dielectric layer 533 according to particular embodiments allow overcoming these drawbacks.

The IMD level 530 of the architecture shown in FIGS. 5A and 5B comprises a first dielectric layer 531 comprising a first dielectric material deposited by high density plasma deposition and facing the first conducting level 520, a second dielectric layer 533 comprising a second dielectric material deposited by chemical vapor deposition and facing the second conducting level 540 and an intermediate dielectric layer 532 deposited by chemical vapor deposition and interposed between the first dielectric layer 531 and the second dielectric layer 533. In particular, the intermediate dielectric layer 532 is interposed between the first dielectric layer 531 and the second dielectric layer 533 in the regions of the IMD level in correspondence to the spacings between the conducting regions of the first conductive level 520. On the contrary, in the regions above the upper surfaces of the conducting regions 521, 522 and 523 of the first conducting level, the structure of the IMD level 530 exhibits a thin layer 531 of dielectric material deposited by means of HDP deposition and a thick layer 533 of dielectric material deposited by means of CVD deposition. The thin layer 531 and the thick layer 533 are directly in contact in these regions. For example, the thin layer 531 can have a thickness of 0.4 m to 0.5 m as measured from the upper surfaces of the conducting regions 521, 522 and 523, and the thick layer 533 can have a thickness of 0.6 m to 0.7 m as measured from the upper surface of the thin layer 531.

Since the structure of the IMD level 530 shown in FIG. 5 comprises regions in correspondence to the conducting regions of the first conducting level 520 comprising a thin layer 531 of dielectric material deposited by means of HDP deposition and a thick layer 533 of dielectric material deposited by means of CVD deposition, it is possible to fabricate the connecting vias having funnel-like shapes. In particular, the thickness of the second dielectric layer 533 in the regions wherein it is directly in contact with the first dielectric layer 531 (i.e. in the regions in correspondence to the conducting regions of the first conducting level 520) is so that the isotropic step of the two-step etch process acts only on the second dielectric layer 533 which is entirely made of dielectric material deposited by means of CVD deposition. Accordingly, the formation of defects and irregularities during the isotropic step is inhibited. In particular, since the upper wide portion of the funnel-shaped via is entirely etched through a single kind of dielectric material (in this case, through a single layer of CVD dielectric material), the formation of irregularities and/or defects is inhibited especially because no differences in the etch rate of the dielectric material can arise during the isotropic etch process.

With reference to FIG. 5A, the isotropic etch step allows the formation of the upper side walls 551*a* and 551*b* of the via 551, of the upper side walls 552*a* and 552*b* of the via 552 and of the upper side walls 553*a* and 553*b* of the via 553. The sidewalls 551*a*, 551*b*, 552*a*, 552*b*, 553*a* and 553*b* exhibit low slope and give rise to the upper wide portions of the funnels. These upper sidewalls do not exhibit irregularities and/or defects because they are entirely formed in the second dielectric layer 533 of the IMD level 530.

The anisotropic etch step allows the formation of the lower side walls 551*c* and 551*d* of the via 551, of the lower sidewalls 552*c* and 552*d* of the via 552 and of the lower sidewalls 553*c* and 553*d* of the via 553. The sidewalls 551*c*, 551*d*, 552*c*, 552*d*, 553*c* and 553*d* are steep and give rise to the lower narrow portions of the funnels. These sidewalls can either be formed through the entire thickness of the first dielectric layer 531 or through a portion of the second dielectric layer 533 and the entire thickness of the first dielectric layer 531. However, since these sidewalls are formed by means of the anisotropic step of the two-step etch process, the formation of defects and/or irregularities is inhibited.

After the formation of the funnel shaped vias such as the vias 551, 552 and 553 shown in FIG. 5A, the vias can be filled with conducting material. In particular, the side walls of the vias can be provided with liner conducting material layers such as for example Ti or TiN. Finally, the vias can be filled with conducting materials such as metals and/or metal alloys. Since the vias are funnel shaped, they can be filled for example with Al and/or with Al alloys such as Al:Si or Al:Cu alloys.

The conducting materials filling the vias can be deposited for instance by means of sputtering and/or evaporation techniques.

Finally, the second conducting level 540 is formed. The second conducting level 540 can be for example the uppermost conducting level of the multilevel interconnect structure. The second conducting level 540 can comprise an adhesion layer made for example of Ti or TiN and guaranteeing the bonding to the upper surface of the IMD level 530. Moreover, the second conducting level 540 can comprise metals, such as Al, and/or metal alloys, such as Al:Si and Al:Cu alloys. The formation of the second conducting level 540 can be performed simultaneously to the filling of the vias. For example, the formation of liner material on the side walls of the vias can be performed simultaneously to the formation of the adhesion layer on the upper surface of the IMD level 530. Moreover, the filling of the vias can be performed with the same process employed for the deposition of conducting materials such as Al or Al alloys for the second conducting level 540.

Thanks to the architecture of the multilevel interconnect structure as shown in FIGS. 5A and 5B, there are no constraints for the lateral dimensions of the system. In particular, it is not necessary for the vias to be fabricated at least at a specific minimum lateral distance from the spacings between the conducting regions of the first conducting level. Accordingly, the architecture of the multilevel interconnect structure as shown in FIGS. 5A and 5B is particularly advantageous for devices wherein the miniaturization level is relevant. In particular, the architecture of the multilevel interconnect structure as shown in FIGS. 5A and 5B is compatible with high miniaturization levels, for instance for devices wherein the maximum lateral width of the conductive regions of the first conducting level is 2 m or less.

Moreover, since the architecture of the multilevel interconnect structure as shown in FIGS. 5A and 5B involves a single dielectric layer deposited by means of HDP deposition, the fabrication costs are reduced.

Accordingly, methods for the formation of multilevel interconnect structures are provided which guarantees the formation of high quality funnel-shaped connecting vias. In particular, the profiles of the funnel-shaped vias are regular and exhibit a very low number of defects and irregularities. Accordingly, the devices provided with the multilevel interconnect structure are reliable and exhibit good electronic properties. Moreover, the processes provide multilevel interconnect structures with funnel-shaped connecting vias without constraints for the width of the spacings between the conducting regions of the first conducting level. In particular, funnel-shaped connecting vias are provided also for architectures wherein the width of the spacings between the conducting regions is in the submicron range, for instance 0.6 m or less. Thanks to the funnel-like shape, the vias can easily be filled with low resistance metals such as Al so that the power dissipation is minimized even in the presence of elevated currents flowing through the system for short times. Accordingly, the risk of damaging and/or destruction due to overheating of the system is minimized.

Even if the present invention has been described with respect to the embodiments disclosed above, it is clear for the person skilled in the art that it is possible to realize several modifications, variations and improvements of the present invention in the light of the teaching described above and within the ambit of the appended claims without departing from the object and the scope of protection of the invention.

For example, it is possible to realize multilevel interconnect structures wherein the first conducting level comprises any number of separate conducting regions. Moreover, it is possible to realize any number of connecting funnel-shaped vias. In particular, the connection between a conducting region of the first conducting level to a conducting region of the second conducting level can be performed by means of a single funnel-shaped via or by more than one adjacent funnel-shaped vias. The position and the dimensions of the vias are determined by means of known techniques employing for example appropriately patterned masks. Furthermore, the multilevel interconnect structures can be employed for several kinds of semiconductor devices such as Bipolar-CMOS-DMOS BCD devices or other kinds of devices.

In addition, those areas in which it is believed that those of ordinary skill in the art are familiar, have not been described herein in order not to unnecessarily obscure the invention described.

Consequently, the invention is not limited to the embodiments described above, but it is only limited by the scope of protection of the enclosed claims.

What is claimed is:

1. A method for fabricating a multilevel interconnect structure with a first conducting level and a second conducting level, comprising:
    depositing a first dielectric layer over the first conducting level;
    depositing an intermediate dielectric layer on the first dielectric layer;
    performing chemical mechanical polishing after depositing the intermediate dielectric layer, wherein the chemical mechanical polishing ends below an upper level of the first dielectric layer;
    depositing a second dielectric layer touching the intermediate dielectric layer and the first dielectric layer, wherein the second dielectric layer includes a lower planar surface that is directly in contact with the first dielectric layer and the intermediate dielectric layer along a single plane of contact; and
    opening a funnel-shaped connecting via through the first dielectric layer and the second dielectric layer, wherein the funnel-shaped connecting via comprises an upper wide portion opened only in the second dielectric layer and a narrower lower portion with two vertical or almost vertical sidewalls extending in both the first dielectric layer and the second dielectric layer,
    wherein the upper wide portion is formed using isotropic etching and the narrower lower portion is formed using anisotropic etching.

2. The method of claim 1, wherein the second dielectric layer is deposited to be directly in contact with both the first dielectric layer and the intermediate dielectric layer.

3. The method of claim 1, wherein the first conducting level comprises separate conducting regions, and wherein the width of the spacing between the separate conducting regions measures 1 µm or less.

4. The method of claim 1, wherein an intermetal dielectric level comprises Silicon Dioxide SiO2 or tetraethyl orthosilicate Si(OC2H5)4.

5. The method of claim 1, further comprising filling the funnel-shaped connecting via with conducting material.

6. The method of claim 5, wherein the conducting material is filled on top of previously deposited conducting material in the first conducting level.

7. The method of claim 6, wherein the previously deposited conducting material touches a bottom wall of the first dielectric layer.

8. The method of claim 1, wherein the first dielectric layer is deposited by high density plasma deposition.

9. The method of claim 1, wherein the funnel-shaped connecting via does not extend through the intermediate dielectric layer.

10. The method of claim 1, wherein the vertical or almost vertical sidewalls are angled at between 80-90 degrees with a bottom end of the first conducting level.

11. A method for fabricating a multilevel interconnect structure with a first conducting level and a second conducting level, comprising:
    depositing, by high density plasma deposition, a first dielectric layer over conducting material in the first conducting level;
    depositing, by chemical vapor deposition, an intermediate dielectric layer on the first dielectric layer;
    performing chemical mechanical polishing after depositing the intermediate dielectric layer, wherein the chemical mechanical polishing ends below an upper level of the first dielectric layer;
    depositing, by chemical vapor deposition, a second dielectric layer touching the intermediate dielectric layer and the first dielectric layer, wherein the second dielectric layer includes a lower planar surface that is directly in contact with the first dielectric layer and the intermediate dielectric layer along a single plane of contact; and
    opening a funnel-shaped connecting via through the first dielectric layer and the second dielectric layer, wherein the funnel-shaped connecting via comprises a funnel-shaped top portion opened only in the second dielectric layer with two sloped or curved sidewalls and a lower portion with two slightly sloped or vertical sidewalls,
    wherein the funnel-shaped top portion is formed using isotropic etching and the narrower lower portion is formed using anisotropic etching.

12. The method of claim 11, wherein the first conducting level comprises separate conducting regions, and wherein the width of spacing between the separate conducting regions measures 1 µm or less.

13. The method of claim 11, wherein an intermetal dielectric level comprises Silicon Dioxide SiO2 or tetraethyl orthosilicate Si(OC2H5)4.

14. The method of claim 11, further comprising filling the funnel-shaped connecting via with additional conducting material down to the conducting material in the first conducting level.

15. A multilevel interconnect structure for a semiconductor device, the multilevel interconnect structure comprising:
    a first dielectric layer comprising a dielectric material deposited by high density plasma deposition facing a first conducting level;
    an intermediate dielectric layer deposited on top of the first dielectric layer;
    a second dielectric layer that includes a lower planar surface that is directly in contact with the first dielectric layer and the intermediate dielectric layer along a single plane of contact; and
    at least one funnel-shaped connecting via for electrically connecting the first conducting level to a second conducting level, wherein an upper wide portion of the funnel-shaped connecting via is opened entirely in a single dielectric material of the second dielectric layer and a lower narrow portion of the funnel-shaped connecting via comprises two vertical or sloped sidewalls passing through both the second dielectric layer and the first dielectric layer,
    wherein the funnel-shaped connecting via is formed using isotropic etching and the lower narrow portion is formed using anisotropic etching.

16. The multilevel interconnect structure of claim 15, wherein the first conducting level comprises two or more separate conducting regions, and wherein spacings between the separate conducting regions measure 1 µm or less.

17. The multilevel interconnect structure of claim 15, wherein an intermetal dielectric level comprises Silicon Dioxide SiO2 or tetraethyl orthosilicate Si(OC2H5)4.

18. The multilevel interconnect structure of claim 15, wherein the second dielectric layer is deposited by chemical vapor deposition.

19. The multilevel interconnect structure of claim 15, further comprising conducting material deposited across a top wall of the second dielectric layer, through the at least one funnel-shaped connecting via, and across a bottom wall of the first dielectric layer.

20. The multilevel interconnect structure of claim 19, wherein the conducting material entirely fills the at least one funnel-shaped connecting via.

* * * * *

UNITED STATES PATENT AND TRADEMARK OFFICE
CERTIFICATE OF CORRECTION

PATENT NO. : 9,105,698 B2
APPLICATION NO. : 14/304111
DATED : August 11, 2015
INVENTOR(S) : Antonio Di Franco et al.

It is certified that error appears in the above-identified patent and that said Letters Patent is hereby corrected as shown below:

On the Title Page, the foreign priority claim is missing. Please add the following:

-- (30) Foreign Application Priority Data
April 27, 2010 (IT) ........................... VI2010A000116 --

In the Specification:

| Column No. | Line No(s). | [Erroneous Term to be replaced] | -- Corrective Term -- |
| --- | --- | --- | --- |
| 2 | 25 | 1 m or more | 1 µm or more |
| 3 | 46-47 | 1 m or more | 1 µm or more |
| 3 | 62 | less than 1 m | less than 1 µm |
| 3 | 63 | less than 1 m | less than 1 µm |
| 7 | 18 | 1 m or less | 1 µm or less |
| 8 | 5-6 | 1 m or less | 1 µm or less |
| 8 | 35 | 1 m or more | 1 µm or more |
| 9 | 26-27 | 1 m or more | 1 µm or more |
| 9 | 29 | less than 1 m | less than 1 µm |
| 9 | 30 | from 0.2 to 0.7 m | from 0.2 to 0.7 µm |
| 9 | 31 | from 0.4 m to 1 m | from 0.4 µm to 1 µm |
| 9 | 61 | from 0.6 m to 1.2 m | from 0.6 µm to 1.2 µm |
| 10 | 40 | 0.5 m to 0.7 m | 0.5 µm to 0.7 µm |
| 10 | 41 | at least 1.2 m | at least 1.2 µm |
| 10 | 43 | width of 0.6 m | width of 0.6 µm |
| 10 | 44 | at least 1.2 m | at least 1.2 µm |
| 11 | 35 | width of 0.8 m | width of 0.8 µm |
| 11 | 36 | at least 1.2 m | at least 1.2 µm |
| 11 | 38 | width of 3.2 m | width of 3.2 µm |
| 11 | 58 | 1 m or more | 1 µm or more |
| 11 | 60 | less than 1 m | less than 1 µm |

Signed and Sealed this
Fifth Day of January, 2016

Michelle K. Lee
*Director of the United States Patent and Trademark Office*

CERTIFICATE OF CORRECTION (continued)
U.S. Pat. No. 9,105,698 B2

In the Specification:

| Column No. | Line No(s). | [Erroneous Term to be replaced] | -- Corrective Term -- |
|---|---|---|---|
| 11 | 61 | from 0.2 m to 0.7 m | from 0.2 μm to 0.7 μm |
| 11 | 63 | from 0.4 m to 1 m | from 0.4 μm to 1 μm |
| 12 | 26 | from 0.6 m to 1.2 m | from 0.6 μm to 1.2 μm |
| 12 | 39 | from 0.6 m to 1.2 m | from 0.6 μm to 1.2 μm |
| 12 | 45 | from 0.7 m to 1 m | from 0.7 μm to 1 μm |
| 14 | 2 | 2 m or less | 2 from or less |
| 14 | 22-23 | 1 m or more | 1 μm or more |
| 14 | 25 | less than 1 m | less than 1 μm |
| 14 | 26 | from 0.2 m to 0.7 m | from 0.2 μm to 0.7 μm |
| 14 | 27 | from 0.4 m to 1 m | from 0.4 μm to 1 μm |
| 14 | 58 | from 0.6 m to 1.2 m | from 0.6 μm to 1.2 μm |
| 15 | 11 | from 0.5 m to 0.8 m | from 0.5 μm to 0.8 μm |
| 15 | 37 | about 0.6 m to 1.2 m | about 0.6 μm to 1.2 μm |
| 15 | 39 | about 0.5 m to 0.8 m | about 0.5 μm to 0.8 μm |
| 15 | 44 | about 0.4 m to 0.5 m | about 0.4 μm to 0.5 μm |
| 15 | 61 | from 0.6 m to 0.7 m | from 0.6 μm to 0.7 μm |
| 15 | 65 | from 1.0 m to 1.2 m | from 1.0 μm to 1.2 μm |
| 16 | 26 | thickness of 2-2.5 m | thickness of 2-2.5 μm |
| 16 | 67 | thickness of 0.4 m to 0.5 m | thickness of 0.4 μm to 0.5 μm |
| 17 | 3 | thickness of 0.6 m to 0.7 m | thickness of 0.6 μm to 0.7 μm |
| 18 | 22 | 2 m or less | 2 μm or less |
| 18 | 40-41 | 0.6 m or less | 0.6 μm or less |